(12) United States Patent
Kellerman et al.

(10) Patent No.: US 8,545,624 B2
(45) Date of Patent: *Oct. 1, 2013

(54) METHOD FOR CONTINUOUS FORMATION OF A PURIFIED SHEET FROM A MELT

(75) Inventors: Peter L. Kellerman, Essex, MA (US); Frank Sinclair, Quincy, MA (US); Frederick Carlson, Potsdam, NY (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1095 days.

This patent is subject to a terminal disclaimer.

(21) Appl. No.: 12/487,058

(22) Filed: Jun. 18, 2009

(65) Prior Publication Data

US 2009/0315220 A1    Dec. 24, 2009

Related U.S. Application Data

(60) Provisional application No. 61/074,249, filed on Jun. 20, 2008.

(51) Int. Cl.
*C30B 13/28* (2006.01)

(52) U.S. Cl.
USPC ............ 117/39; 117/26; 117/38; 117/46; 117/47

(58) Field of Classification Search
None
See application file for complete search history.

(56) References Cited

U.S. PATENT DOCUMENTS

| | | | |
|---|---|---|---|
| 3,093,087 A | 6/1963 | Hansen | |
| 3,128,912 A | 4/1964 | Cash | |
| 3,430,680 A | 3/1969 | Leghorn | |
| 3,607,115 A | 9/1971 | Bleil | |
| 3,635,791 A | 1/1972 | Bly et al. | |
| 3,681,033 A | 8/1972 | Blyeil | |
| 3,759,671 A | 9/1973 | Bleil | |
| 3,976,229 A | 8/1976 | Jackson | |
| 4,094,731 A | 6/1978 | Keyser et al. | |
| 4,121,965 A | 10/1978 | Leipold | |
| 4,200,621 A | 4/1980 | Liaw et al. | |
| 4,226,834 A | 10/1980 | Shudo et al. | |
| 4,246,249 A | 1/1981 | Dawless | |
| 4,264,407 A | 4/1981 | Shudo et al. | |
| 4,289,571 A | 9/1981 | Jewett | |
| 4,316,764 A | 2/1982 | Kudo et al. | |
| 4,322,263 A | 3/1982 | Kudo et al. | |
| 4,329,195 A | 5/1982 | Kudo | |
| 4,417,944 A | 11/1983 | Jewett | |
| 4,428,783 A | 1/1984 | Gessert | |

(Continued)

FOREIGN PATENT DOCUMENTS

| JP | 59-008688 A | 1/1984 |
|---|---|---|
| JP | 2002-289599 A | 10/2002 |
| JP | 2009-099359 A | 5/2009 |

OTHER PUBLICATIONS

D.N. Jewett et al., "Progress in Growth of Silicon Ribbon by a Low Angle, High Rate Process," 16th Photovoltaic Specialists Conference, San Diego, CA, Sep. 27-30, 1982, pp. 86-89, Institute of Electrical and Electronics Engineers, New York, NY, USA.

(Continued)

*Primary Examiner* — Yelena G Gakh

(57) ABSTRACT

An apparatus to pump a melt is disclosed. The pump has a chamber that defines a cavity configured to hold the melt. A gas source is in fluid communication with the chamber. A first valve is between the chamber and a first pipe and a second valve is between the chamber and a second pipe. The valves may be check valves in one embodiment.

9 Claims, 12 Drawing Sheets

(56) References Cited

U.S. PATENT DOCUMENTS

| | | | |
|---|---|---|---|
| 4,447,289 | A | 5/1984 | Geissler et al. |
| 4,594,229 | A | 6/1986 | Ciszek et al. |
| 4,599,132 | A | 7/1986 | Jewett et al. |
| 4,627,887 | A * | 12/1986 | Sachs .................... 117/24 |
| 4,873,063 | A | 10/1989 | Bleil |
| 5,055,157 | A | 10/1991 | Bleil |
| 5,069,742 | A | 12/1991 | Bleil |
| 5,074,758 | A | 12/1991 | McIntyre |
| 5,229,083 | A | 7/1993 | Bleil |
| 5,394,825 | A | 3/1995 | Schmid et al. |
| 5,454,423 | A | 10/1995 | Tsuchida et al. |
| 6,090,199 | A | 7/2000 | Wallace, Jr. et al. |
| 2008/0196209 | A1 * | 8/2008 | Friestad .................... 23/295 R |
| 2009/0231597 | A1 | 9/2009 | Rowland et al. |
| 2009/0233396 | A1 | 9/2009 | Kellerman et al. |

OTHER PUBLICATIONS

B. Kudo, "Improvements in the Horizontal Ribbon Growth Technique for Single Crystal Silicon," Journal of Crystal Growth 50, 1980, pp. 247-259, North-Holland Publishing Co., Amsterdam, Netherlands.

Bruce Chalmers, "High Speed Growth of Sheet Crystals," Journal of Crystal Growth 70, 1984, pp. 3-10, North-Holland Publishing Co., Amsterdam, Netherlands.

Paul D. Thomas & Robert A. Brown, "Rate Limits in Silicon Sheet Growth: The Connections Between Vertical and Horizontal Methods," J. of Crystal Growth 82, 1987, pp. 1-9, North-Holland Publishing Co., Amsterdam, Netherlands.

T.F. Ciszek, "Techniques for the Crystal Growth of Silicon Ingots and Ribbons," J. of Crystal Growth 66, 1984, pp. 655-672, North-Holland Publishing Co., Amsterdam, Netherlands.

M.E. Glicksman & P.W. Voorhees, "Analysis of Morphologically Stable Horizontal Ribbon Crystal Growth," J. of Electronic Materials, vol. 12, No. 1, 1983, pp. 161-179, Springer Science+Business Media, Cambridge, MA, USA.

William C. Dash, "Growth of Silicon Crystals Free from Dislocations," J. of App. Phys., vol. 30, No. 4, Apr. 1959, pp. 459-474 American Institute of Physics, Melville, NY, USA.

* cited by examiner

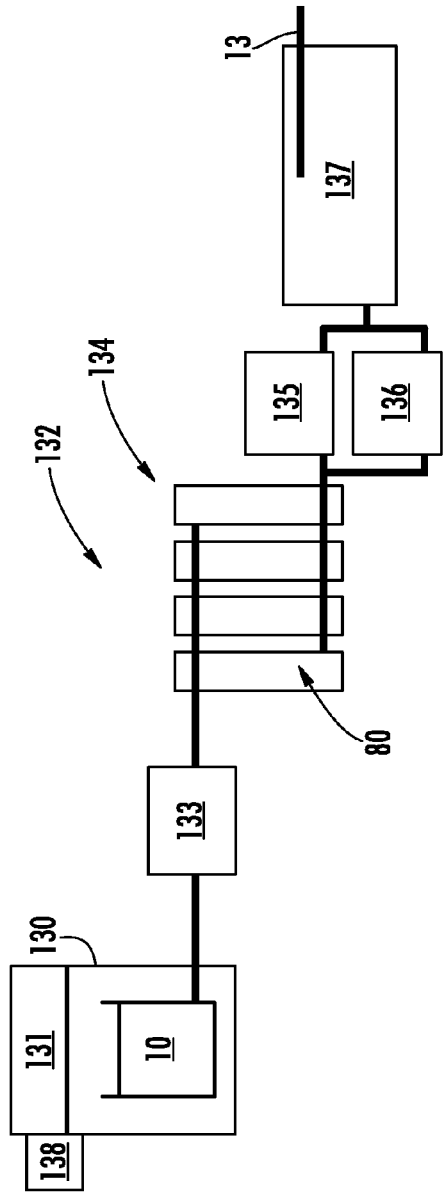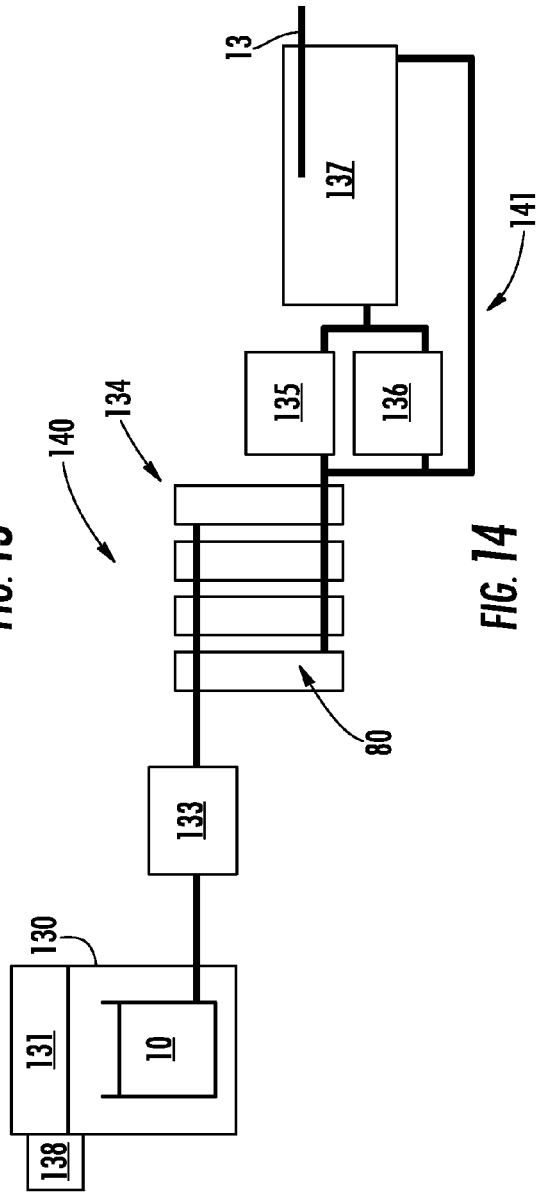

METHOD FOR CONTINUOUS FORMATION OF A PURIFIED SHEET FROM A MELT

CROSS-REFERENCE TO RELATED APPLICATIONS

This application claims priority to the provisional patent application entitled "Silicon Melt Purification and Delivery System," filed Jun. 20, 2008 and assigned U.S. App. No. 61/074,249, the disclosure of which is hereby incorporated by reference.

FIELD

This invention relates to pumping a melt and, more particularly, to pumping a melt used to form a sheet from the melt.

BACKGROUND

Silicon wafers or sheets may be used in, for example, the integrated circuit or solar cell industry. Demand for solar cells continues to increase as the demand for renewable energy sources increases. As these demands increase, one goal of the solar cell industry is to lower the cost/power ratio. There are two types of solar cells: silicon and thin film. The majority of solar cells are made from silicon wafers, such as single crystal silicon wafers. Currently, a major cost of a crystalline silicon solar cell is the wafer on which the solar cell is made. The efficiency of the solar cell, or the amount of power produced under standard illumination, is limited, in part, by the quality of this wafer. Any reduction in the cost of manufacturing a wafer without decreasing quality will lower the cost/power ratio and enable the wider availability of this clean energy technology.

The highest efficiency silicon solar cells may have an efficiency of greater than 20%. These are made using electronics-grade monocrystalline silicon wafers. Such wafers may be made by sawing thin slices from a monocrystalline silicon cylindrical boule grown using the Czochralski method. These slices may be less than 200 μm thick. To maintain single crystal growth, the boule must be grown slowly, such as less than 10 μm/s, from a crucible containing a melt. The subsequent sawing process leads to approximately 200 μm of kerf loss, or loss due to the width of a saw blade, per wafer. The cylindrical boule or wafer also may need to be squared off to make a square solar cell. Both the squaring and kerf losses lead to material waste and increased material costs. As solar cells become thinner, the percent of silicon waste per cut increases. Limits to ingot slicing technology, however, may hinder the ability to obtain thinner solar cells.

Other solar cells are made using wafers sawed from polycrystalline silicon ingots. Polycrystalline silicon ingots may be grown faster than monocrystalline silicon. However, the quality of the resulting wafers is lower because there are more defects and grain boundaries and this lower quality results in lower efficiency solar cells. The sawing process for a polycrystalline silicon ingot is as inefficient as a monocrystalline silicon ingot or boule.

Another solution that may reduce silicon waste is cleaving a wafer from a silicon ingot after ion implantation. For example, hydrogen, helium, or other noble gas ions are implanted beneath the surface of the silicon ingot to form an implanted region. This is followed by a thermal, physical, or chemical treatment to cleave the wafer from the ingot along this implanted region. While cleaving through ion implantation can produce wafers without kerf losses, it has yet to be proven that this method can be employed to produce silicon wafers economically.

Yet another solution is to pull a thin ribbon of silicon vertically from a melt and then allow the pulled silicon to cool and solidify into a sheet. The pull rate of this method may be limited to less than approximately 18 mm/minute. The removed latent heat during cooling and solidifying of the silicon must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient. For example, the width may be limited to less than 80 mm and the thickness may be limited to 180 μm.

Horizontal ribbons of silicon that are physically pulled from a melt also have been tested. In one method, a seed attached to a rod is inserted into the melt and the rod and resulting sheet are pulled at a low angle over the edge of the crucible. The angle and surface tension are balanced to prevent the melt from spilling over the crucible. It is difficult, however, to initiate and control such a pulling process. Access must be given to the crucible and melt to insert the seed, which may result in heat loss. Additional heat may be added to the crucible to compensate for this heat loss. This may cause vertical temperature gradients in the melt that may cause non-laminar fluid flow. Also, a possibly difficult angle of inclination adjustment to balance gravity and surface tension of the meniscus formed at the crucible edge must be performed. Furthermore, since heat is being removed at the separation point of the sheet and melt, there is a sudden change between heat being removed as latent heat and heat being removed as sensible heat. This may cause a large temperature gradient along the ribbon at this separation point and may cause dislocations in the crystal. Dislocations and warping may occur due to these temperature gradients along the sheet.

Production of thin sheets separated horizontally from a melt, such as by using a spillway, has not been performed. Producing sheets horizontally from a melt by separation may be less expensive than silicon sliced from an ingot and may eliminate kerf loss or loss due to squaring. Sheets produced horizontally from a melt by separation also may be less expensive than silicon cleaved from an ingot using hydrogen ions or other pulled silicon ribbon methods. Furthermore, separating a sheet horizontally from a melt may improve the crystal quality of the sheet compared to pulled ribbons. A crystal growth method such as this that can reduce material costs would be a major enabling step to reduce the cost of silicon solar cells. Yet to operate, the melt may require pumping. Accordingly, there is a need in the art for an improved apparatus and method to pump a melt.

SUMMARY

According to a first aspect of the invention, an apparatus for pumping is provided. The apparatus comprises a chamber that defines a cavity configured to hold a melt of a semiconductor material. A gas source, a first pipe, and a second pipe are in fluid communication with the chamber. A first valve is disposed between the first pipe and the chamber and a second valve is disposed between the chamber and the second pipe.

According to a second aspect of the invention, a method of pumping is provided. The method comprises closing a second valve and opening a first valve. A melt of a semiconductor material flows into a chamber through the first valve while the second valve is closed and while the chamber is at a first pressure. The first pressure in the chamber is increased to a second pressure. The first valve is closed and the second valve is opened. The melt flows from the chamber through the second valve.

According to a third aspect of the invention, a method of forming a sheet is provided. The method comprises pumping a melt to a sheet forming apparatus. The melt is flowed within the sheet forming apparatus. A sheet forms on the melt by cooling the melt. The melt and sheet flow and are separated. The melt is circulated to the sheet forming apparatus. The melt is drained from the sheet forming apparatus when solutes in the melt reach a predetermined threshold. A second melt is pumped to the sheet forming apparatus.

BRIEF DESCRIPTION OF THE DRAWINGS

For a better understanding of the present disclosure, reference is made to the accompanying drawings, which are incorporated herein by reference and in which:

FIG. 13 is a block diagram of a first embodiment of a sheet formation system;

FIG. 14 is a block diagram of a second embodiment of a sheet formation system;

DETAILED DESCRIPTION

The embodiments of the apparatus and methods herein are described in connection with solar cells. However, these also may be used to produce, for example, integrated circuits, flat panels, or other substrates known to those skilled in the art. Furthermore, while the melt is described herein as being silicon, the melt may contain germanium, silicon and germanium, gallium, gallium nitride, other semiconductor materials, or other materials known to those skilled in the art. Thus, the invention is not limited to the specific embodiments described below.

Figure 1:
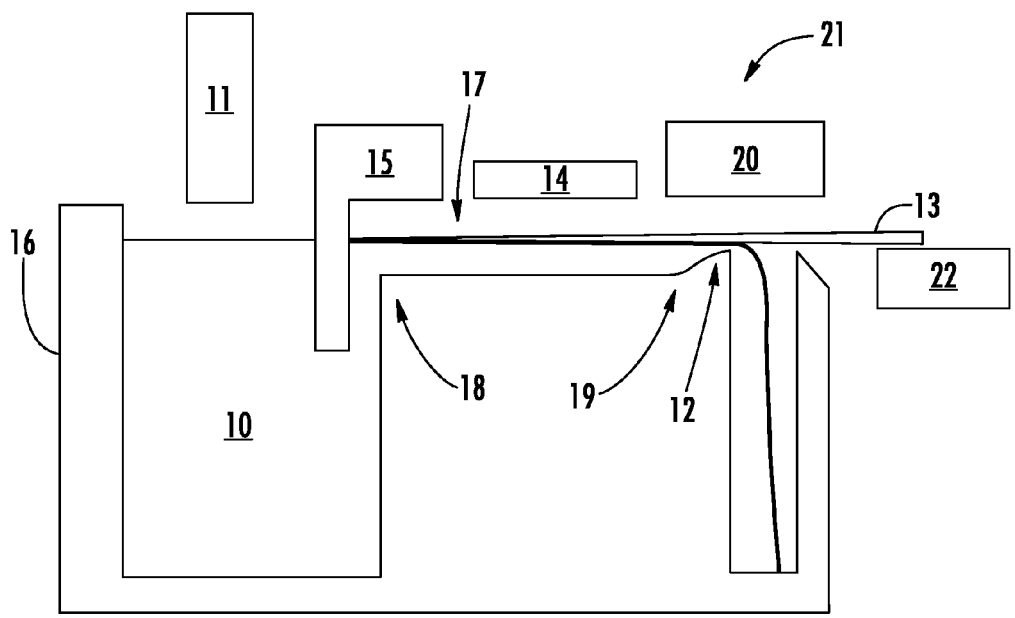
FIG. 1 is a cross-sectional side view of an embodiment of an apparatus that separates a sheet from a melt.

FIG. 1 is a cross-sectional side view of an embodiment of an apparatus that separates a sheet from a melt. The sheet-forming apparatus 21 has a vessel 16 and panels 15 and 20. The vessel 16 and panels 15 and 20 may be, for example, tungsten, boron nitride, aluminum nitride, molybdenum, graphite, silicon carbide, or quartz. The vessel 16 is configured to contain a melt 10. The melt 10 may be silicon. The melt 10 may be replenished through the feed 11 in one embodiment. The feed 11 may contain solid silicon or solid silicon and germanium. The melt 10 may be pumped into the vessel 16 in another embodiment. A sheet 13 will be formed on the melt 10. In one instance, the sheet 13 will at least partly float within the melt 10. While the sheet 13 is illustrated in FIG. 1 as floating in the melt 10, the sheet 13 may be at least partially submerged in the melt 10 or may float on top of the melt 10. In one instance, only 10% of the sheet 13 protrudes from above the top of the melt 10. The melt 10 may circulate within the apparatus 21.

This vessel 16 defines at least one channel 17. This channel 17 is configured to hold the melt 10 and the melt 10 flows from a first point 18 to a second point 19 of the channel 17. In one instance, the environment within the channel 17 is still to prevent ripples in the melt 10. The melt 10 may flow due to, for example, a pressure difference, gravity, a magnetohydrodynamic drive, a screw pump, and impeller pump, a wheel, or other methods of transport. The melt 10 then flows over the spillway 12. This spillway 12 may be a ramp, a weir, a small dam, or a corner and is not limited to the embodiment illustrated in FIG. 1. The spillway 12 may be any shape that allows a sheet 13 to be separated from the melt 10.

The panel 15 is configured in this particular embodiment to extend in part below the surface of the melt 10. This may prevent waves or ripples from disturbing the sheet 13 as it forms on the melt 10. These waves or ripples may form due to addition of melt material from the feed 11, pumping, or other causes known to those skilled in the art.

In one particular embodiment, the vessel 16 and panels 15 and 20 may be maintained at a temperature slightly above approximately 1687 K. For silicon, 1687 K represents the freezing temperature or interface temperature. By maintaining the temperature of the vessel 16 and panels 15 and 20 to slightly above the freezing temperature of the melt 10, the cooling plate 14 may function using radiation cooling to obtain the desired freezing rate of the sheet 13 on or in the melt 10. The cooling plate 14 in this particular embodiment is composed of a single segment or section but may include multiple segments or sections in another embodiment. The bottom of the channel 17 may be heated above the melting temperature of the melt 10 to create a small vertical temperature gradient in the melt 10 at the interface to prevent constitutional supercooling or the formation of dendrites, or branching projections, on the sheet 13. However, the vessel 16 and panels 15 and 20 may be any temperature above the melting temperature of the melt 10. This prevents the melt 10 from solidifying on the vessel 16 and panels 15 and 20.

The apparatus 21 may be maintained at a temperature slightly above the freezing temperature of the melt 10 by at least partially or totally enclosing the apparatus 21 within an enclosure. If the enclosure maintains the apparatus 21 at a temperature above the freezing temperature of the melt 10, the need to heat the apparatus 21 may be avoided or reduced and heaters in or around the enclosure may compensate for any heat loss. This enclosure may be isothermal with non-isotropic conductivity. In another particular embodiment, the heaters are not disposed on or in the enclosure and are rather in the apparatus 21. In one instance, different regions of the vessel 16 may be heated to different temperatures by imbedding heaters within the vessel 16 and using multi-zone temperature control.

The enclosure may control the environment where the apparatus 21 is disposed. In a specific embodiment, the enclosure contains an inert gas. This inert gas may be maintained at above the freezing temperature of the melt 10. The inert gas may reduce the addition of solutes into the melt 10 that may cause constitutional instabilities during the sheet 13 formation process.

The apparatus 21 includes a cooling plate 14. The cooling plate 14 allows heat extraction as the sheet 13 forms on the melt 10. The cooling plate 14 may cause the sheet 13 to freeze on or in the melt 10 when the temperature of the cooling plate 14 is lowered below the freezing temperature of the melt 10. This cooling plate 14 may use radiation cooling and may be fabricated of, for example, graphite, quartz, or silicon carbide. The cooling plate 14 may remove heat from the liquid melt 10 quickly, uniformly, and in controlled amounts. Disturbances to the melt 10 may be reduced while the sheet 13 forms to prevent imperfections in the sheet 13.

The heat extraction of the heat of fusion and heat from the melt 10 over the surface of the melt 10 may enable faster production of the sheet 13 compared to other ribbon pulling methods while maintaining a sheet 13 with low defect density. Cooling a sheet 13 on the surface of the melt 10 or a sheet 13 that floats on the melt 10 allows the latent heat of fusion to be removed slowly and over a large area while having a large horizontal flow rate.

The dimensions of the cooling plate 14 may be increased, both in length and width. Increasing the length may allow a faster melt 10 flow rate for the same vertical growth rate and resulting sheet 13 thickness. Increasing the width of the cooling plate 14 may result in a wider sheet 13. Unlike the vertical sheet pulling method, there is no inherent physical limitation on the width of the sheet 13 produced using embodiments of the apparatus and method described in FIG. 1.

In one particular example, the melt 10 and sheet 13 flow at a rate of approximately 1 cm/s. The cooling plate 14 is approximately 20 cm in length and approximately 25 cm in width. A sheet 13 may be grown to approximately 100 µm in thickness in approximately 20 seconds. Thus, the sheet may grow in thickness at a rate of approximately 5 µm/s. A sheet 13 of approximately 100 µm in thickness may be produced at a rate of approximately 10 m²/hour.

Thermal gradients in the melt 10 may be minimized in one embodiment. This may allow the melt 10 flow to be steady and laminar. It also may allow the sheet 13 to be formed via radiation cooling using the cooling plate 14. A temperature difference of approximately 300 K between the cooling plate 14 and the melt 10 may form the sheet 13 on or in the melt 10 at a rate of approximately 7 µm/s in one particular instance.

The region of the channel 17 downstream from the cooling plate 14 and the under the panel 20 may be isothermal. This isothermal region may allow annealing of the sheet 13.

After the sheet 13 is formed on the melt 10, the sheet 13 is separated from the melt 10 using the spillway 12. The melt 10 flows from the first point 18 to the second point 19 of the channel 17. The sheet 13 will flow with the melt 10. This transport of the sheet 13 may be a continuous motion. In one instance, the sheet 13 may flow at approximately the same speed that the melt 10 flows. Thus, the sheet 13 may form and be transported while at rest with respect to the melt 10. The shape of the spillway 12 or orientation of the spillway 12 may be altered to change the velocity profile of the melt 10 or sheet 13.

The melt 10 is separated from the sheet 13 at the spillway 12. In one embodiment, the flow of the melt 10 transports the melt 10 over the spillway 12 and may, at least in part, transport the sheet 13 over the spillway 12. This may minimize or prevent breaking the crystal in the sheet 13 because no external stress is applied to the sheet 13. The melt 10 will flow over the spillway 12 away from the sheet 13 in this particular embodiment. Cooling may not be applied at the spillway 12 to prevent thermal shock to the sheet 13. In one embodiment, the separation at the spillway 12 occurs in near-isothermal conditions.

The sheet 13 may be formed faster in the apparatus 21 than by being pulled normal to the melt because the melt 10 may flow at a speed configured to allow for proper cooling and crystallization of the sheet 13 on the melt 10. The sheet 13 will flow approximately as fast as the melt 10 flows. This reduces stress on the sheet 13. Pulling a ribbon normal to a melt is limited in speed because of the stresses placed on the ribbon due to the pulling. The sheet 13 in the apparatus 21 may lack any such pulling stresses in one embodiment. This may increase the quality of the sheet 13 and the production speed of the sheet 13.

The sheet 13 may tend to go straight beyond the spillway 12 in one embodiment. This sheet 13 may be supported after going over the spillway 12 in some instances to prevent breakage. A support device 22 is configured to support the sheet 13. The support device 22 may provide a gas pressure differential to support the sheet 13 using, for example, a gas or air blower. After the sheet 13 is separated from the melt 10, the temperature of the environment where the sheet 13 is located may slowly be changed. In one instance, the temperature is lowered as the sheet 13 moves farther from the spillway 12.

In one instance, the growth of the sheet 13, annealing of the sheet 13, and separation of the sheet 13 from the melt 10 using the spillway 12 may take place in an isothermal environment. The separation using the spillway 12 and the approximately equal flow rates of the sheet 13 and melt 10 minimize stress or mechanical strain on the sheet 13. This increases the possibility of producing a single crystal sheet 13.

In another embodiment, a magnetic field is applied to the melt 10 and sheet 13 in the apparatus 21. This may dampen oscillatory flows within the melt 10 and may improve crystallization of the sheet 13.

Figure 2:
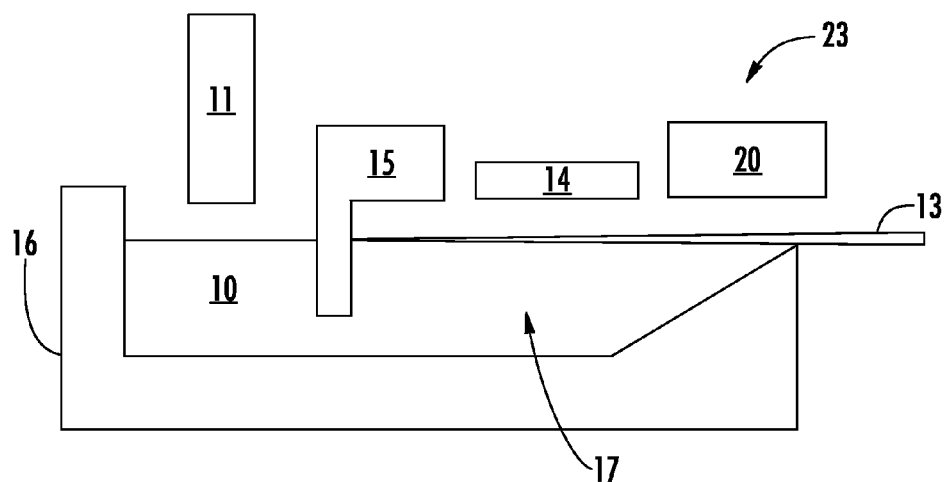
FIG. 2 is a cross-sectional side view of an embodiment of an apparatus that pulls a sheet from a melt.

FIG. 2 is a cross-sectional side view of an embodiment of an apparatus that pulls a sheet from a melt. In this embodiment, the apparatus 23 pulls the sheet 13 from the melt 10. The melt 10 may not be circulating in a channel 17 in this embodiment and the sheet 13 may be pulled using a seed. A sheet 13 may be formed through cooling by the cooling plate 14 and the resulting sheet may be drawn out of the melt 10.

Both the embodiments of FIGS. 1-2 use a cooling plate 14. Different cooling temperatures across the length of the cooling plate 14, different flow rates of the melt 10 or pull speeds of the sheet 13, the length of the various sections of the apparatus 21 or apparatus 23, or the timing within the apparatus 21 or apparatus 23 may be used for process control. If the melt 10 is silicon, a polycrystalline sheet 13 or single crystal sheet 13 may be formed in the apparatus 21. In either the embodiment of FIG. 1 or FIG. 2, the apparatus 21 or apparatus 23 may be contained in an enclosure.

FIG. 1 and FIG. 2 are only two examples of apparatuses that can form sheets 13 from a melt 10. Other apparatuses or methods of vertical or horizontal sheet 13 growth are possible. The embodiments of the methods and apparatuses described herein may be applied to any vertical or horizontal sheet 13 growth method or apparatus and are not limited solely to the specific embodiments of FIGS. 1-2.

Figure 3:
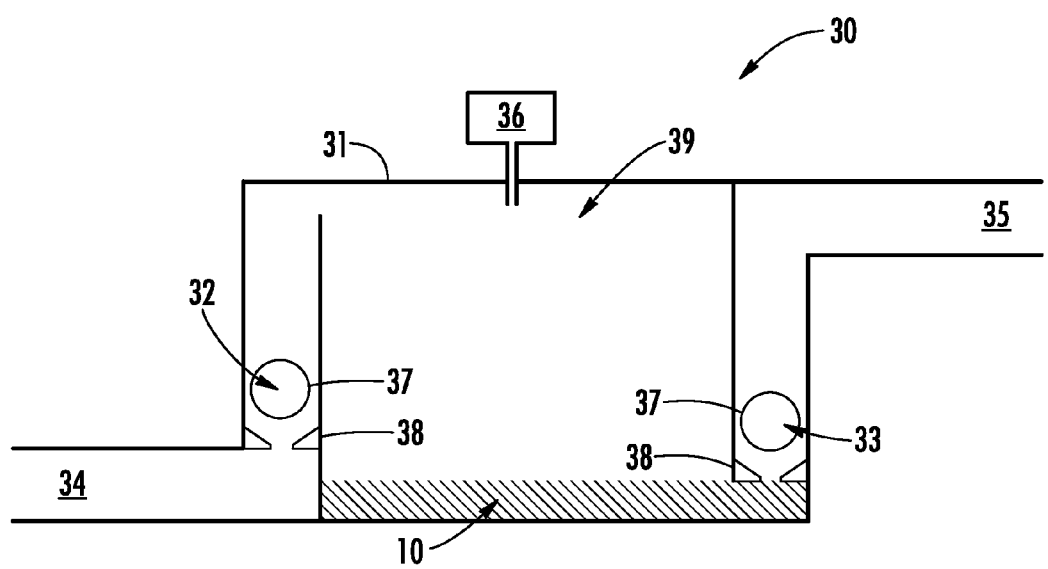
FIG. 3 is a cross-sectional side view of an embodiment of a pump.

FIG. 3 is a cross-sectional side view of an embodiment of a pump. The pump 30 is configured to transport the melt 10 at a temperature above the freezing temperature of the melt 10. In one instance, this melt 10 is silicon and the pump 30 can operate above the freezing temperature of silicon. The pump 30 may be located in a thermally-insulated chamber maintained above the freezing temperature of the melt 10.

The pump 30 includes a pump chamber 31 that defines a cavity 39, an input valve 32 near the first pipe 34, and an output valve 33 near the second pipe 35. The first pipe 34 may be an inlet for the melt 10 and the second pipe 35 may be an outlet for the melt 10. A gas source 36 provides, for example, pressure-controlled argon. While argon is specifically listed, other inert or noble gases also may be used. The gas source 36 may include a gas valve to regulate flow of the gas from the gas source 36 to the chamber 31. The gas valve may allow gas flow both in and out of the chamber 31. All components of the pump 30 in contact with the melt 10 may be made of a non-contaminating material, such as boron nitride, quartz, silicon carbide, or silicon nitride. The pressure in the pump 30 will draw in a melt 10 and pump out the melt 10 at a desired pressure. The pump 30 is powered by the gas source 36. This pump 30 may provide near-continuous delivery of a melt 10 at any desired pressure (referred to as $P_f$) above the pressure of the first pipe 34 (referred to as $P_0$).

In the embodiment of FIG. 3, both the input valve 32 and output valve 33 are check valves, although other types of valves may be used. A check valve is a non-return valve or one-way valve that allows a fluid to flow only in one direction through the valve. In this particular embodiment, the input valve 32 and output valve 33 each include a body 37 and a seat 38. The body 37 in this embodiment is round, though other shapes are possible. The body 37 is configured to fit in the seat 38, which may be a socket in one embodiment. When the input valve 32 or output valve 33 are sealed, the body 37 is at rest against the seat 38. The body 37 may be coated or fabricated with boron nitride, quartz, silicon nitride, or silicon carbide.

Figure 4A:
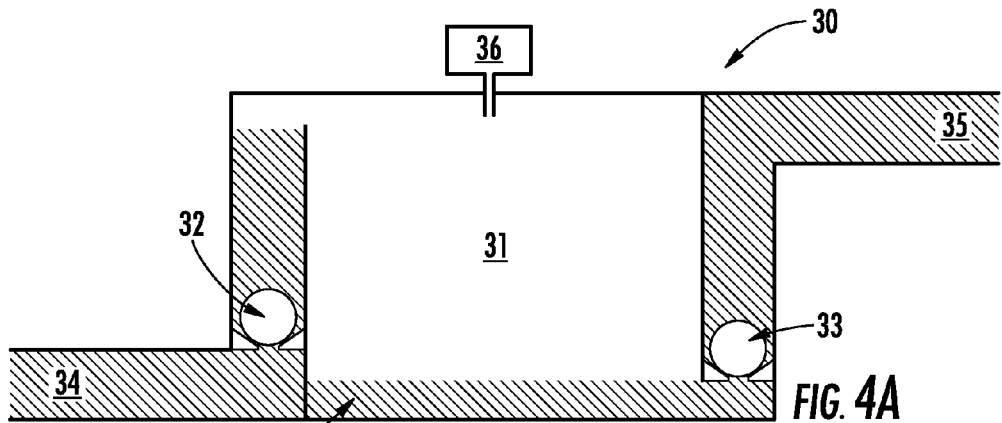
FIGS. 4A-4D are cross-sectional side views of pumping using the pump embodiment of FIG. 3.
Figure 4B:
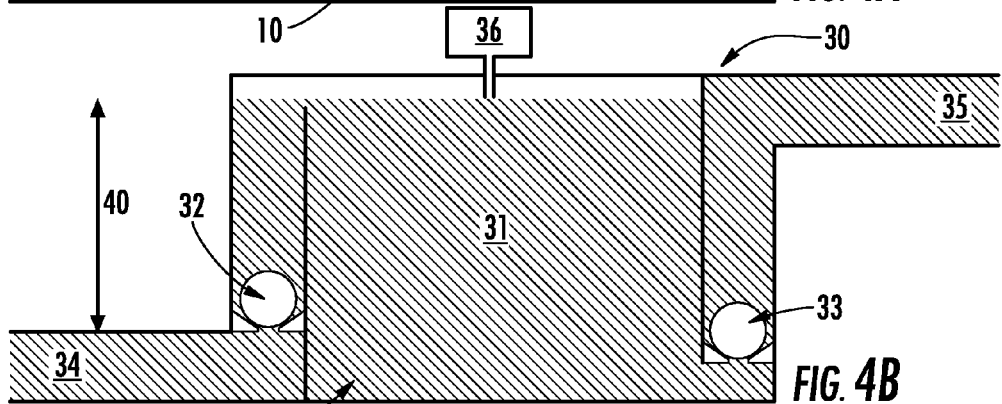
Figure 4C:
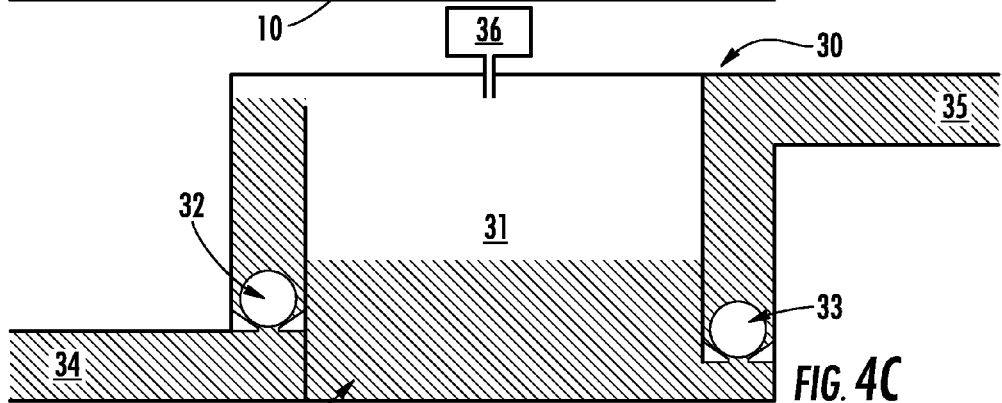
Figure 4D:
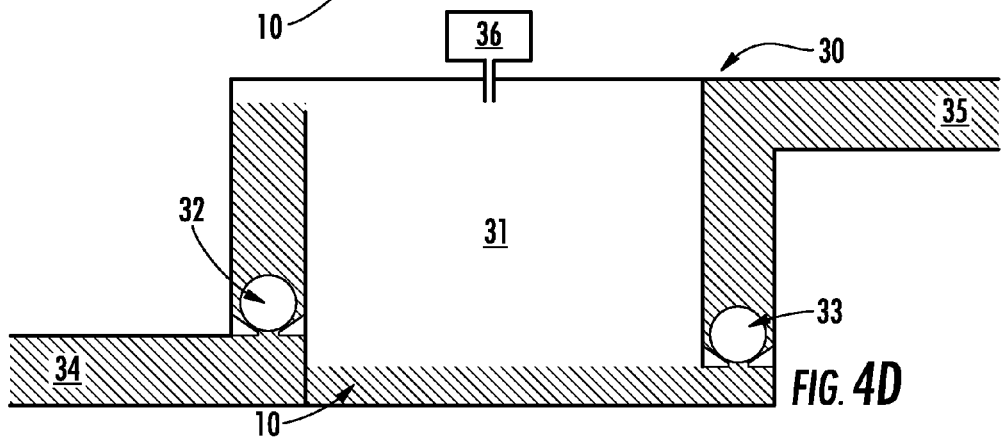

FIGS. 4A-4D are cross-sectional side views of pumping using the pump embodiment of FIG. 3. FIG. 4A represents the initial state where pressure in the pump chamber 31 (P) is approximately equal to the pressure ($P_0$) in the first pipe 34 ($P=P_0$). Thus, the input valve 32 and output valve 33 are each closed. In FIG. 4B, the pressure in the pump chamber 31 is lowered. This may be represented by the equation $P<P_0-\rho g h_i$ where $\rho$ is the density of the melt 10, g is gravity, and $h_i$ is the height the melt 10 must travel above the input valve 32 to enter the pump chamber 31 represented by the line 40. Because the pressure in the pump chamber 31 is below the pressure of the first pipe 34, the input valve 32 opens and the melt 10 fills the pump chamber 31. The low pressure in the pump chamber 31 will keep the output valve 33 closed. In FIG. 4C, the pressure in the pump chamber 31 has been increased using gas from the gas source 36. Now the pressure in the pump chamber 31 is approximately more than the pressure in the second pipe 35. This may be represented by the equation $P>P_f+\rho g h_i$. Because the pressure in the pump chamber 31 is above the pressure of the second pipe 35, the output valve 33 opens and the melt 10 empties from the pump chamber 31. The high pressure in the pump chamber 31 will keep the input valve 32 closed. In FIG. 4D, the pump 30 goes back to its initial state in FIG. 4A where pressure in the pump chamber 31 is approximately equal to the pressure in the first pipe 34 ($P=P_0$).

The process illustrated in FIGS. 4A-4D may be repeated to produce a flow of the melt 10. The speed of the melt 10 flow may be adjusted as necessary. One or more pumps 30 may be used alone or at least partially simultaneously to ensure a proper flow or speed of the melt 10. For example, two pumps may be used in parallel, such that as the melt 10 flow from a first pump ends, the melt 10 flow from a second pump begins. This may ensure constant melt 10 delivery.

Figure 5:
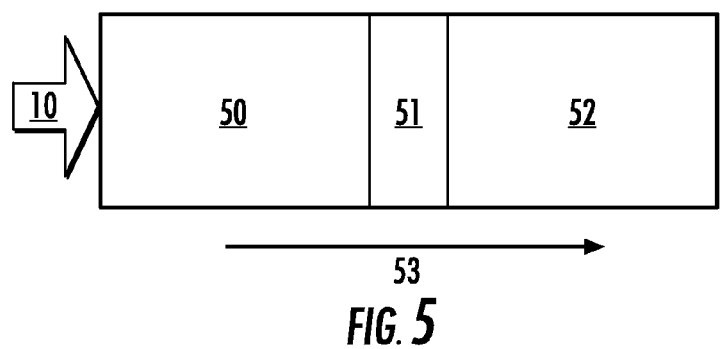
FIG. 5 is a block diagram of a filter.

FIG. 5 is a block diagram of a filter. In this particular embodiment, a filter 51 is located between a higher pressure zone 50 and a lower pressure zone 52. The pressure different between the higher pressure zone 50 and the lower pressure zone 52 will cause a melt 10 to flow in the direction 53 through the filter 51. The filter 51 may remove particles in the melt 10 such as silicon dioxide or silicon carbide. This filter 51 may be, for example, a silicon nitride mesh or membrane. The silicon nitride mesh or membrane may be manufactured by, for example, NanoStructures, Inc. or may be DUR-SIN™. The filter 51 may include boron nitride granules in other embodiments.

Figure 6:
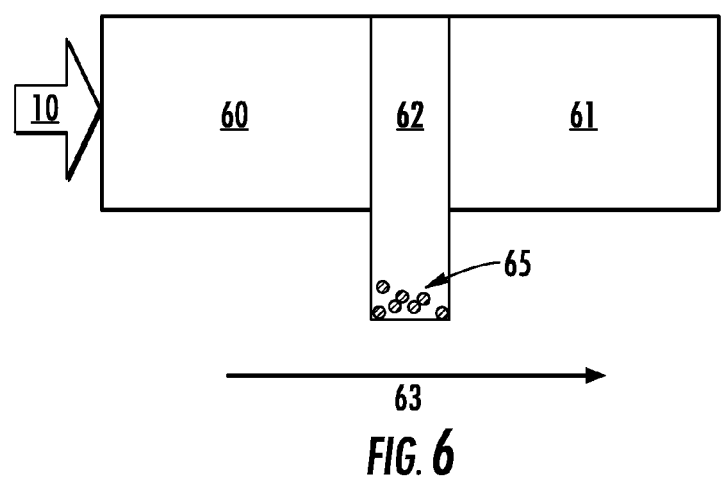
FIG. 6 is a cross-sectional side view of a first embodiment of a particle trap.

FIG. 6 is a cross-sectional side view of a first embodiment of a particle trap. The particle trap 62 collects particles 65, such as silicon dioxide, boron, iron, or silicon carbide, in the melt 10 as the melt 10 flows through the particle trap 62. Silicon carbide, iron, boron, and some forms of silicon dioxide have higher densities than a silicon melt 10. For example, a silicon melt 10 has a density of approximately 2.49 g/cc while silicon dioxide has a density of approximately 2.65 g/cc and silicon carbide has a density of approximately 3.1 g/cc. These particles 65 will sink to the bottom of the particle trap 62 while the melt 10 flows in the direction 63 from the melt input 60 to the melt output 61 through the particle trap 62. The melt 10 may flow in the direction 63 due to a pressure difference.

Figure 7:
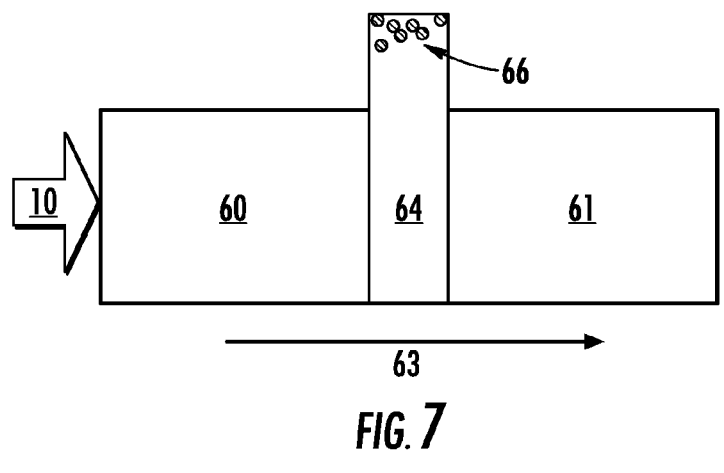
FIG. 7 is a cross-sectional side view of a second embodiment of a particle trap.

FIG. 7 is a cross-sectional side view of a second embodiment of a particle trap. Certain particles 66, such as carbon, nitrogen, or air, have a lower density than a silicon melt 10. These particles 66 will float to the top of the particle trap 64 while the melt 10 flows in the direction 63 from the melt input 60 to the melt output 61 through the particle trap 64. The melt 10 may flow in the direction 63 due to a pressure difference. This particle trap 64 also may capture volatile compounds in the melt 10. The particle trap 64 also may include a scoop, ramp, or skimmer to remove some of the particles 66 from the melt 10.

Figure 8:
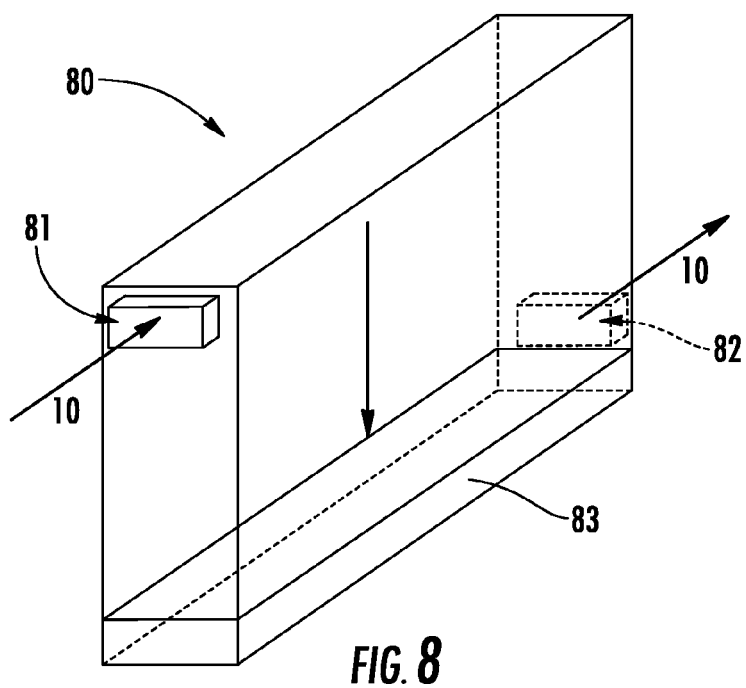
FIG. 8 is a perspective view of a first embodiment of a purifying system.

FIG. 8 is a perspective view of a first embodiment of a purifying system. This system can remove contaminants from a melt 10 that have a segregation coefficient less than 1, such as carbon or metals. A segregation coefficient ($\gamma$) of a solute in a substance is the ratio of the solute's equilibrium concentration in the solid and liquid near the liquid-solid interface. When $\gamma<1$, the solute is rejected from the solid into the liquid. When $\gamma>1$, the solute is rejected from the liquid into the solid.

The apparatus 80 is made of a non-contaminating material, such as boron nitride, quartz, silicon carbide, or silicon nitride. The apparatus 80 is filled with a melt 10 through an inlet port 81. The inlet port 81 is at the top of the apparatus 80 in this particular embodiment. The melt 10 is drained from the apparatus 80 using the outlet port 82. The outlet port 82 is at the bottom of the apparatus 80 in this particular embodiment. The inlet port 81 and outlet port 82 may be located on the same side of the apparatus 80 or other sides of the apparatus 80 than that illustrated in FIG. 8. The outlet port 82 is above the slug 83 of solutes that will form at the bottom of the apparatus 80 during the purifying process. The slug 83 is a high-concentration frozen block of solutes.

FIGS. 9A-9F are cross-sectional front views of stages of a purification process using the purifying system embodiment of FIG. 8. FIGS. 9A-9F occur chronologically, but other embodiments and methods are possible. The melt 10 fills the apparatus 80 through the inlet port 81. The apparatus 80 includes coolers 90 and heaters 91 that can be translated with respect to the apparatus 80 in at least a first direction. The translation may be uniform and at a speed to allow freezing and melting in one embodiment. The coolers 90 and heaters 91 each may have shielding and insulation. The heat transfer to and from the coolers 90 and heaters 91 may be conductive, convective, radiative, or a combination of any of the previous three forms of heat transfer. While two coolers 90 and two heaters 91 are illustrated, other numbers of coolers 90 and heaters 91 are possible as is known to those skilled in the art.

In one instance, the coolers 90 and heaters 91 are bands or rings that encircle the apparatus 80. In another instance, the coolers 90 and heaters 91 are plates or blocks near the apparatus 80. The coolers 90 and heaters 91 may be operatively linked using a translation mechanism, as in this embodiment, or may be translated separately or independently of one another. In yet another instance, the coolers 90 and heaters 91 are embedded in the apparatus 80 and different heating or cooling zones are selectively activated over time.

The coolers 90 and heaters 91 may have radiation shields between each other and the rest of the system to minimize temperature disturbances. The cooler 90 may operate at a temperature less than the freezing temperature of the melt 10 in one embodiment. Thus, the cooler 90 and melt 10 may be cooled to below the freezing temperature of the melt 10. The heaters 91 may contain an ohmic heater, induction coils, or resistance heaters, although other types of heating are possible. Fluid flow to the cooler 90 may regulate the temperature of the cooler 90 in one embodiment, though other methods of cooling are possible.

Figure 9:
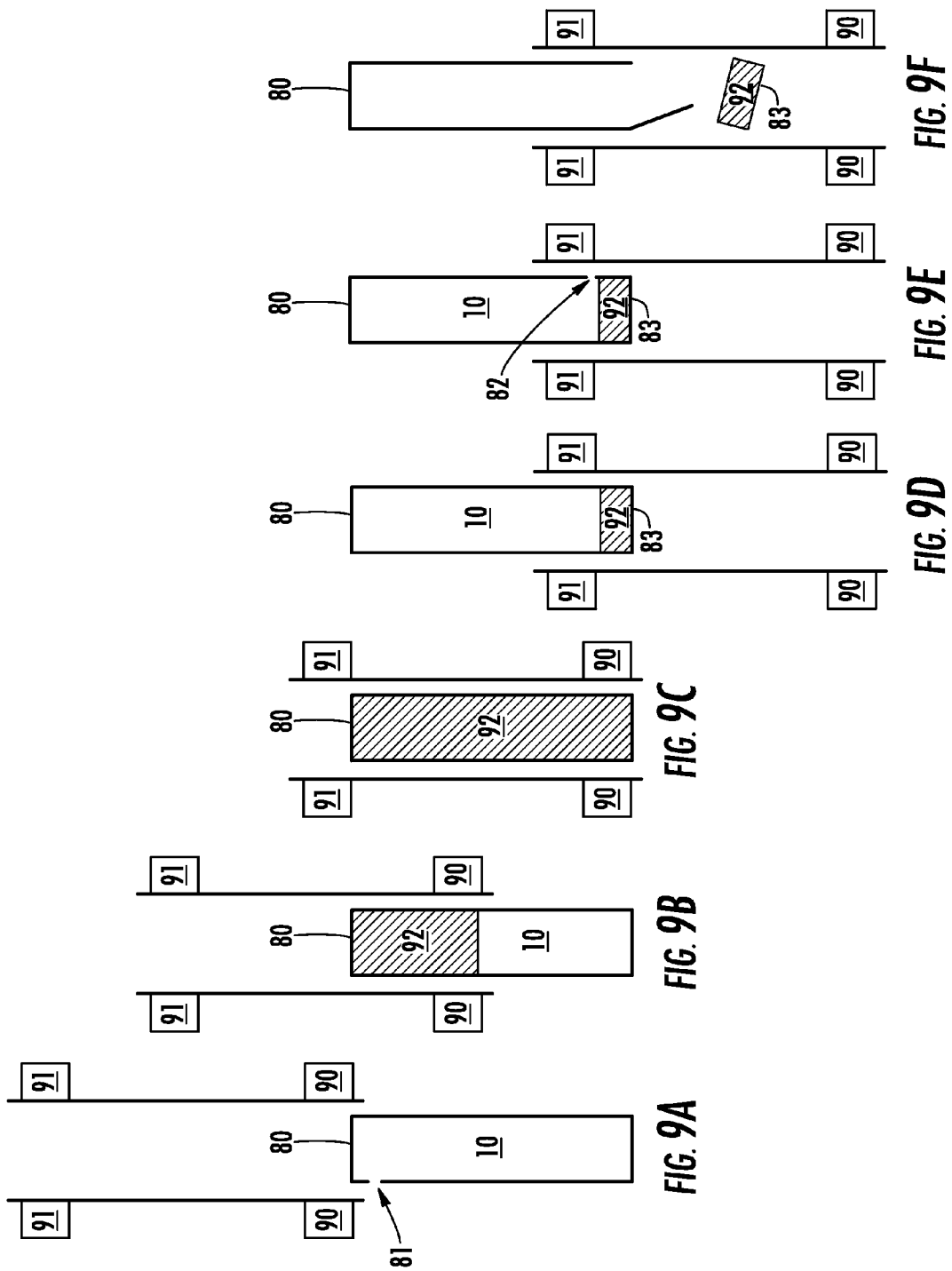
FIGS. 9A-9F are cross-sectional front views of stages of a purification process using the purifying system embodiment of FIG. 8.

In the particular embodiment of FIGS. 9A-9F, the coolers 90 and heaters 91 are translated with respect to the apparatus 80 and may freeze the entire melt 10 inside the apparatus 80 from, for example, top to bottom (FIGS. 9B to 9C). This will form a frozen melt 92 (illustrated by shaded lines).

Many solutes have a lower solubility in a solid than a melt, so the concentration of solutes is reduced in the solid. As the entire melt 10 is frozen to form the frozen melt 92, a region of higher solute concentration will be created at the interface between the melt 10 and the frozen melt 92. This interface slowly moves from one end of the apparatus 80 to the other, eventually forming a slug 83 containing a high solute concentration. This process may work with all solutes with a segregation coefficient $$\gamma C_s/C_l < 1$$

where $\gamma$ is the segregation coefficient, $C_s$ is the concentration in solid at the solid-liquid interface, and $C_l$ is the concentration in liquid. Thus, these solutes are less soluble in solid than liquid at the solid-liquid interface. Many compounds, such as, for example, silver, aluminum, gold, copper, carbon, iron, lithium, manganese, nickel, sulfur, and tantalum may be removed from the melt 10 in this manner. Other solutes known to those skilled in the art likewise may be removed from the melt. Parameters of the coolers 90 and heaters 91 may be configured to remove at least some of any oxygen or boron. For example, multiple passes or freezing and melting cycles may be required to remove oxygen or boron.

Figure 12:
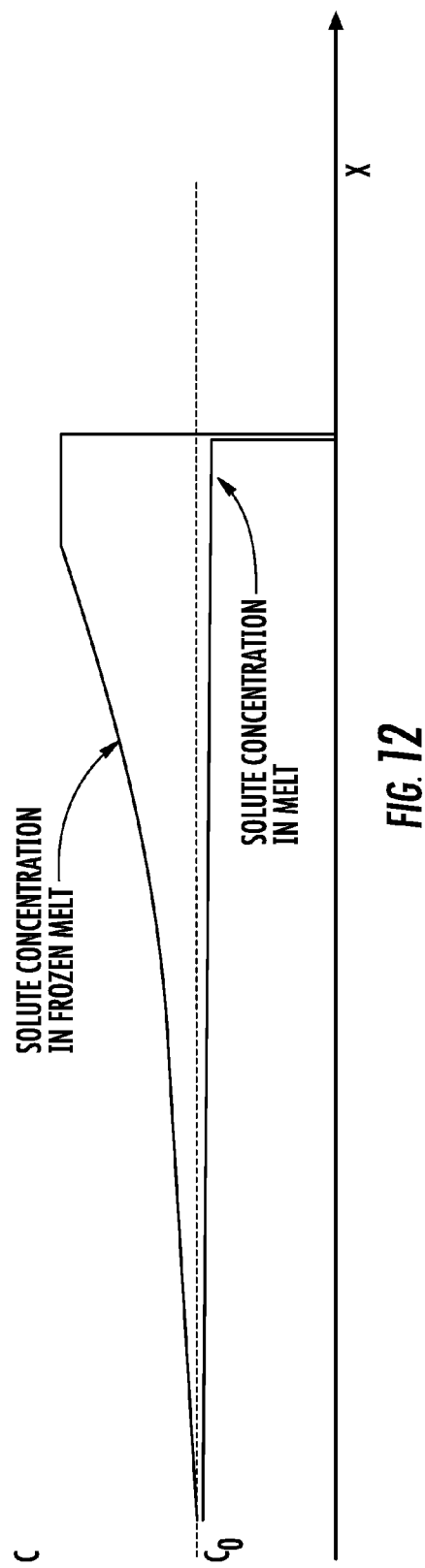
FIG. 12 is a graph comparing solute concentration.

The effects of this are illustrated in FIG. 12. In FIG. 12, the solute concentration (C) in the frozen melt 92 increases as the coolers 90 and heaters 91 translate (in the x direction) across the apparatus 80.

The frozen melt 92 may then be re-melted using the heaters 91 to re-form the melt 10 (illustrated in FIGS. 9C to 9D). This will leave the slug 83 with a high concentration of solutes at the bottom of the apparatus 80. This process may be repeated in one embodiment to attain a melt 10 of the desired purity. This may require re-melting of the slug 83 or growing the slug 83 over multiple freezing and melting cycles. In FIG. 9E, the melt 10 is removed through the outlet port 82. In FIG. 9F, the slug 83 is removed from the apparatus 80. This may be by dropping it from the apparatus 80, by re-melting the slug and draining or pumping it from the apparatus 80, or by some other removal method.

A higher purity melt 10 may lower the possibility of constitutional supercooling in the melt 10. The freezing temperature of the melt 10 may be lower due to presence of solutes. This constitutional supercooling may produce dendritic growth when the melt 10 is frozen. A high purity melt 10 also may lower the possibility of precipitate or platelet formation or attachment of any precipitates or platelets to any frozen melt 10. Furthermore, a high purity melt 10 may produce a higher efficiency solar cell due to a reduction in impurities. Thus, in one embodiment the melt 10 has a mass fraction of solute that is less than $10^{-8}$.

Figure 11:
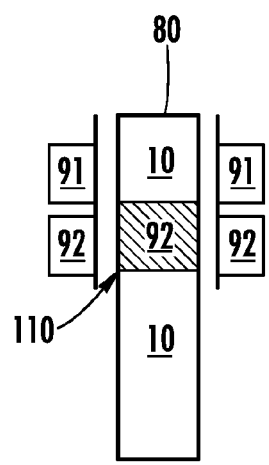
FIG. 11 is a cross-sectional front view of a third embodiment of a purifying system.

While the process of FIGS. 9A-9F is illustrated in a vertical configuration to use gravity and the property of solid silicon floating on liquid silicon, the process also may be performed horizontally. To perform the process horizontally, the dimensions of the apparatus 80 are reduced such that gravitational effects do not interfere with the process. In an alternate embodiment illustrated in FIG. 11, only a small zone of the liquid melt 10 forms into the frozen melt 92 at any given time. This forms a freeze zone 110. This freeze zone 110 proceeds down the length of the apparatus 80 while the coolers 90 and heaters 91 translate with respect to the apparatus 80. The top of the freeze zone 110 is re-melted into the melt 10 as the freeze zone 110 proceeds from one end of the apparatus 80 to the other. To prevent the frozen melt 92 from floating upward, a movable serrated wall may be employed to keep the frozen melt 92 moving from one end of the apparatus 80 to the other.

Figure 10:
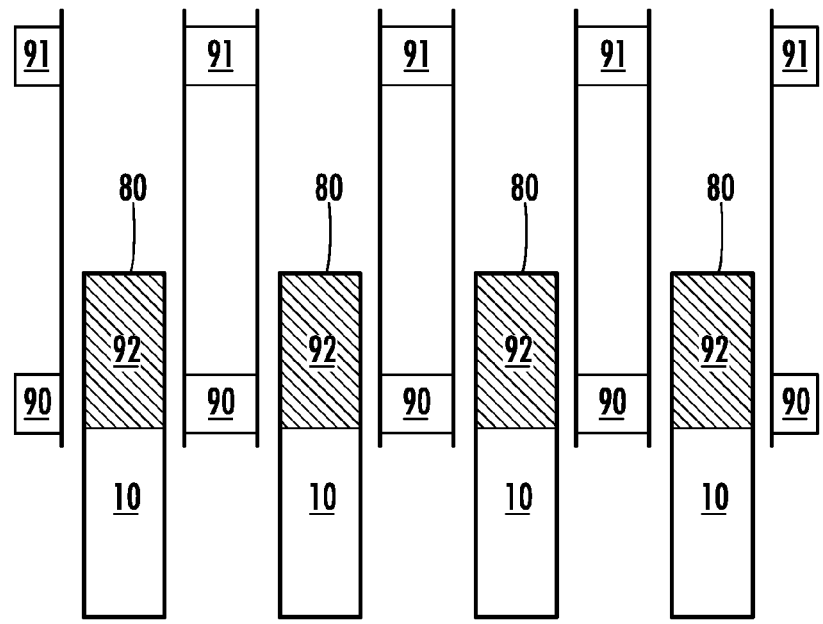
FIG. 10 is a cross-sectional front view of a second embodiment of a purifying system.

Multiple apparatuses 80 can be operated in tandem for greater throughput. FIG. 10 is a cross-sectional front view of a second embodiment of a purifying system. The coolers 90 and heaters 91 in this particular embodiment are translated together, but the coolers 90 and heaters 91 for each individual apparatus 80 also may be translated independently. This may allow increased throughput by staggering the timing of each apparatus 80.

FIG. 13 is a block diagram of a first embodiment of a sheet formation system. The system 132 includes a crucible 130 and load-lock 131, a pump 133, a purifying system 134 with at least one apparatus 80, pumps 135 and 136, and a sheet forming apparatus 137. This system 132 may form a sheet 13. The pumps 133, 135, 136 may correspond to the pump 30 or some other pump. The sheet forming apparatus 137 may correspond to the apparatus 21, apparatus 23, or another vertical or horizontal sheet forming system known to those skilled in the art. The system 132 may further include a filter 51, particle trap 62, or particle trap 64 that is, for example, upstream of the purifying system 134 or between the pumps 135, 136 and the sheet forming apparatus 137. The purified melt 10 is supplied to the sheet forming apparatus 137 without exposure to air in this embodiment, thus avoiding oxidation present in methods that add feedstock directly to the sheet forming apparatus 137.

In one embodiment, a crucible 130 may be used to initially form the melt 10. This melt 10 is then pumped from the crucible 130. In one embodiment, the crucible 130 is made of a non-contaminating material, such as boron nitride or silicon nitride. In another embodiment, the crucible 130 may be composed of a material that includes carbon such as silicon carbide or graphite. Use of materials that include carbon, however, may require the melt 10 to be subsequently filtered or purified. The crucible 130 also may be composed of an oxygen-containing compound, such as silica or quartz. The crucible 130 may include heaters. These may be, for example, inductive, resistive, or ohmic heaters. In one particular embodiment, the crucible 130 is thermally isolated so a uniform temperature above the freezing temperature of the melt 10 may be maintained throughout the melt 10 and to minimize the power required to melt the melt 10.

This crucible 130 may include a load-lock 131 to allow the addition of feedstock material to the melt 10. The load-lock 131 may be incorporated into the crucible 130 or may be a separate unit from the crucible 130. After introduction of the feedstock material, such as silicon, the load-lock 131 and crucible 130 may be closed and evacuated. The crucible 130 may then be filled with an inert gas, such as argon or another noble gas, using the gas source 138 and heated to melt the feedstock material into the melt 10.

Oxygen may be removed from the melt 10 in the crucible 130 due to the evaporation of silicon oxide. Silicon oxide may be volatile at temperatures below the melting temperature of silicon. In one particular embodiment, the argon and silicon oxide are purged one or more times and the argon is refilled one or more times to remove the oxygen from the load-lock 131 or crucible 130. If the walls of the load-lock 131 or crucible 130 contain carbon, such as in silicon carbide surfaces or graphite heaters, carbon monoxide may form. This carbon monoxide may need to be pumped out to prevent contamination of the melt 10. Hydrogen, for example, may be added to the load-lock 131 or crucible 130 in one embodiment to act as a reducing agent or to enhance removal of oxygen from the melt 10.

In one instance, a feedstock, such as silicon, is added to the load-lock 131 of the crucible 130. This silicon may be varying grade and may be of varying shapes or forms. Silicon pellets with large oxidized surfaces may be used in one particular embodiment. The load-lock 131 is then closed, evacuated, and pumped to vacuum to remove oxygen or other gases. The feedstock is transferred to the crucible 130, the load-lock 131 and crucible 130 are filled with an inert gas, such as argon, and the feedstock is melted to form a melt 10. The argon gas is purged as necessary to remove silicon oxide and carbon monoxide contamination. The pump 133 then pumps the melt 10 to the purifying system 134. The melt 10 may be pumped through a filter 51, particle trap 62, or particle trap 64 prior to entering the purifying system 134. The apparatuses 80 are filled with the melt 10 and begin purifying the melt 10 as illustrated in FIGS. 9A-9F. The purified melt 10 fills at least one of the pumps 135, 136 and is pumped into the sheet forming apparatus 137 at a controlled rate. This controlled rate may match the rate of crystallization in the sheet forming apparatus 137 that forms the sheet 13.

In one instance, while the melt 10 is being pumped from, for example, pump 135, the melt 10 to fill the pump 136 is being purified in the purifying system 134. This purification is timed so that the pump 136 is ready to begin pumping to the sheet forming apparatus 137 before or when the originally-filled pump 135 is empty to allow a continuous delivery of melt 10 to the sheet forming apparatus 137.

FIG. 14 is a block diagram of a second embodiment of a sheet formation system. This system 140 includes a recycle 141 from the sheet forming apparatus 137 to the pump 136. This may allow continuous circulation of the melt 10 in the sheet forming apparatus 137.

Figure 15:
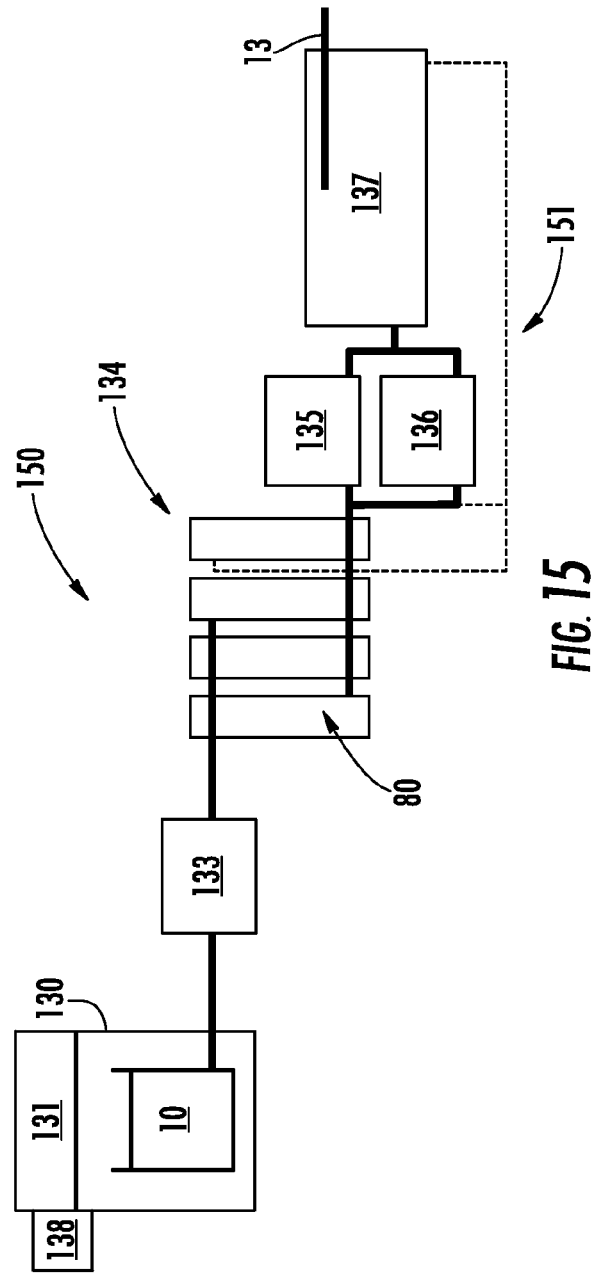
FIG. 15 is a block diagram of a third embodiment of a sheet formation system.

FIG. 15 is a block diagram of a third embodiment of a sheet formation system. This system 150 includes a recycle illustrated by the dotted line 151 from the sheet forming apparatus 137 to the purifying system 134 and pump 136. In an alternate embodiment, the recycle is in fluid communication with only the purifying system 134. This may allow continuous circulation of the melt 10 in the sheet forming apparatus 137 and will purify the melt 10 of any solutes that were added in the sheet forming apparatus 137 or elsewhere in the system 150. Thus, the melt 10 will not intensify with solutes or impurities. If the sheet 13 is produced by the sheet forming apparatus 137, solutes with a segregation coefficient less than 1 will intensify in the melt 10 in accordance with the following equation:

$$\frac{dx(t)}{dt} = \frac{\left(\frac{dV}{dt}\right)}{V_0} x_0 - \frac{\left(\frac{dV}{dt}\right)}{V_0} kx(t)$$

where $V_0$ is the volume of the crucible 130 or sheet forming apparatus 137, x is the solute concentration in the melt 10, k is the segregation coefficient of the solute, and V is the freeze volume rate (which may be equal to the melt 10 input rate into the sheet forming apparatus 137 in one instance). Within, for example, the crucible 130, x(t) will vary from $x_0$.

For example, in a production sized system with 1.6 L of melt 10 that produces 10 $m^2$/h of 100 μm thick sheet 13, the concentration of a solute with a segregation coefficient of <0.01 would increase by an order of magnitude in approximately 16 hours. The same phenomenon used for purifying the melt 10 in the purifying system 134 causes the intensification of the solutes as the sheet 13 is being produced in the sheet forming apparatus 137. Thus, all solutes can be removed at the same rate as these solutes are "generated" by the production of the sheet 13 in the sheet forming apparatus 137. This allows a continuous state of pure melt 10 or a low solute concentration in the melt 10 while the sheet 13 is produced.

In yet another embodiment, another purification system similar to the purifying system 134 is connected only to the sheet forming apparatus 137. This will only flow back to the sheet forming apparatus 137. This allows removal of solutes in the recycle stream separate from the stream from the purifying system 134.

Figure 16:
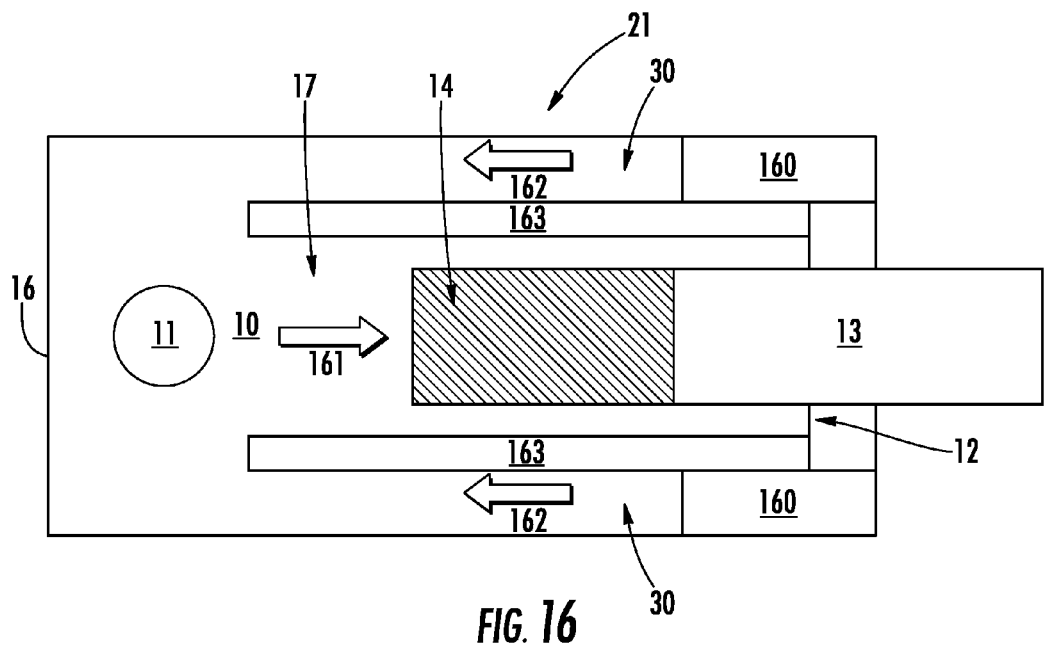
FIG. 16 is a top plan view of a first embodiment of an apparatus that separates a sheet from a melt.

FIG. 16 is a top plan view of a first embodiment of an apparatus that separates a sheet from a melt. This embodiment of the apparatus 21 includes pumps 160. While two pumps 160 are illustrated in FIG. 16, other embodiments may use one pump 160 or more than two pumps 160. These pumps 160 may correspond to pumps 30 of FIG. 3. The pumps 160 cause the melt 10 to flow in the directions 162 and, consequently, direction 161 around the walls 163 and over the spillway 12. These pumps 160 may provide an uninterrupted flow of melt 10 within the apparatus 21. The melt 10 may be pumped to a higher vertical position using pumps 160.

Figure 17:
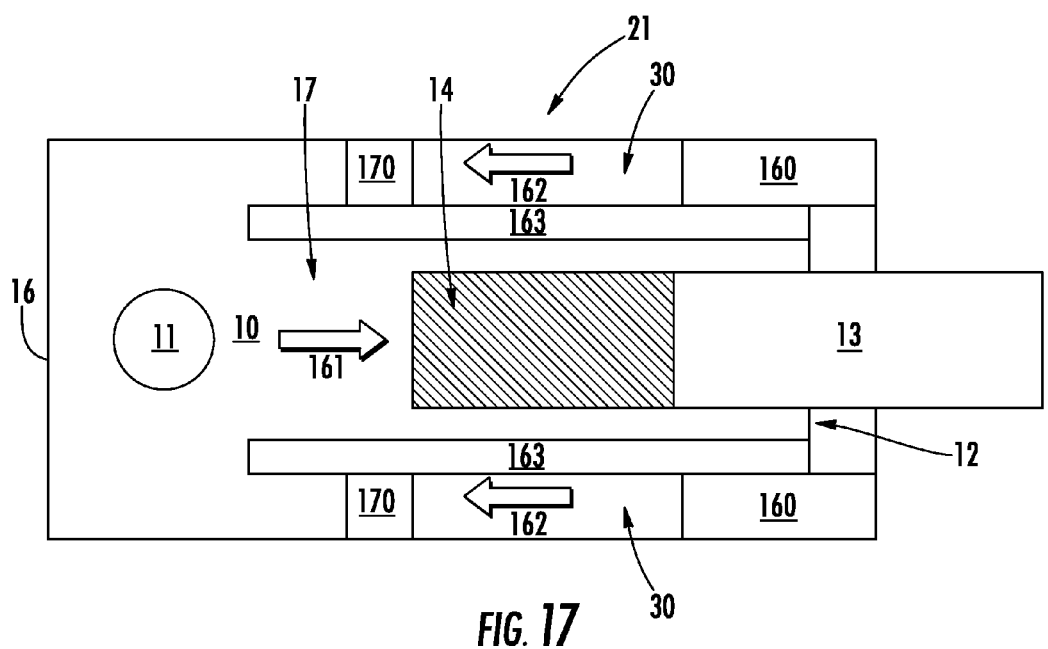
FIG. 17 is a top plan view of a second embodiment of an apparatus that separates a sheet from a melt.

FIG. 17 is a top plan view of a second embodiment of an apparatus that separates a sheet from a melt. Besides including pumps 160, this embodiment of the apparatus 21 includes units 170. These units 170 may correspond to, for example, a filter 51, particle trap 62, or particle trap 64 from FIGS. 5-7. The units 170 also may be other filtration systems known to those skilled in the art.

Figure 18:
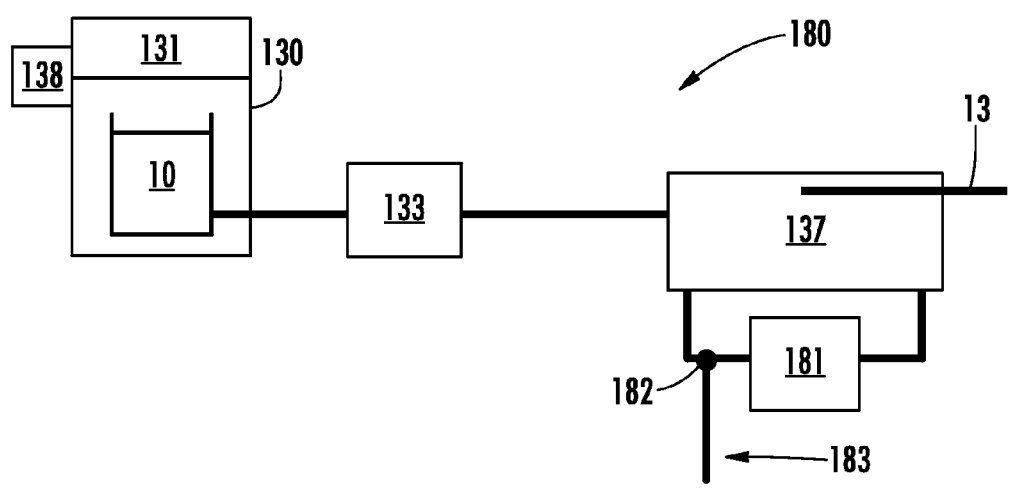
FIG. 18 is a block diagram of a fourth embodiment of a sheet formation system.

FIG. 18 is a block diagram of a fourth embodiment of a sheet formation system. The system 180 includes a crucible 130 and load-lock 131, a gas source 138, a pump 133 and 181, and a sheet forming apparatus 137. This system 180 may form a sheet 13. The pumps 133 and 181 may correspond to the pump 30 or some other pump. The sheet forming apparatus 137 may correspond to the apparatus 21, apparatus 23, or another vertical or horizontal sheet forming system known to those skilled in the art. The system 180 may further include a filter 51, particle trap 62, or particle trap 64 that is, for example, upstream of the sheet forming apparatus 137 or the pump 181.

The system 180 further includes a valve 182 and an outlet pipe 183. The melt 10 may be electronics-grade silicon in this example. The melt 10 is continually circulated through the sheet forming apparatus 137 using the pump 181. When the solute concentration level in the melt 10 is above a certain threshold or prior to dendritic growth on the sheet 13, the valve 182 opens and the melt 10 is drained from the sheet forming apparatus 137 using the outlet pipe 183. In one instance, this threshold is a solute mass fraction of greater than $10^{-8}$. This may be a solute mass fraction sufficient to cause constitutional instabilities in the melt 10 and dendritic growth on the sheet 13.

The crucible 130 will produce new melt 10 for the sheet forming apparatus 137 that is pumped to the sheet forming apparatus 137 using the pump 133. This pumping may allow continuous operation of the sheet forming apparatus 137. In one instance, this new melt 10 may have a solute mass fraction of approximately $10^{-10}$. The melt 10 drained using the outlet pipe 183 may be lower grade silicon in this instance and may be used for other purposes. For example, this melt 10 drained using the outlet pipe 183 may be solar-grade silicon.

In one particular embodiment, the system 180 further includes a reservoir for the melt 10 with the lower solute concentration. As the melt 10 is drained using the outlet pipe 183, the reservoir may allow continuous operation of the sheet forming apparatus 137. This reservoir may be positioned downstream of the pump 133 and upstream of the sheet forming apparatus 137.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming a sheet comprising:
   using a pump to transport a melt to a sheet forming apparatus, wherein said melt is a semiconductor material;
   flowing said melt in a horizontal direction within a channel of said sheet forming apparatus, said melt having a surface parallel to said horizontal direction;
   forming said sheet on said surface of said melt in a region proximate a cooling plate by cooling said melt while said melt is flowing using radiative cooling of said cooling plate, wherein said cooling plate has a temperature lower than a freezing temperature of said melt;
   flowing said sheet on said surface of said melt in said horizontal direction within said channel after said forming, wherein said sheet flows parallel to said surface in said horizontal direction;
   separating said sheet from said melt, wherein said sheet is transported in said horizontal direction after being separated from said melt;
   draining said melt from said sheet forming apparatus when a solute concentration in said melt reaches a predetermined threshold determined based on a volume of said sheet that is formed from said melt, wherein said volume is determined by measuring a length, width, and thickness of said sheet;
   transporting a second melt different than said first melt to said channel of said sheet forming apparatus during said draining thereby maintaining continuous formation of said sheet; and
   circulating said melt within said sheet forming apparatus from a second point downstream of said cooling plate to a first point upstream of said cooling plate, wherein said circulating is prior to said draining.

2. The method of claim 1, wherein said melt is selected from the group consisting of silicon, silicon and germanium, gallium, and gallium nitride.

3. The method of claim 1, wherein said separating is performed using a spillway.

4. The method of claim 1, wherein said pump comprises a chamber defining a cavity configured to hold said melt, a first valve disposed between a first pipe and said chamber, and a second valve disposed between said chamber and a second pipe and wherein said using said pump comprises:
   closing said second valve;
   opening said first valve;
   flowing said melt into said chamber through said first valve while said second valve is closed, said chamber being at a first pressure;
   increasing said first pressure in said chamber to a second pressure;
   closing said first valve while said chamber is at said second pressure;
   opening said second valve while said chamber is at said second pressure; and
   flowing said melt from said chamber into said sheet forming apparatus through said second valve after said chamber is at said second pressure.

5. The method of claim 1, wherein said cooling plate is separated from a surface of said melt.

6. The method of claim 1, wherein said transporting said second melt provides continuous delivery to said sheet forming apparatus during said draining.

7. The method of claim 1, wherein said transporting said second melt uses said pump.

8. The method of claim 1, wherein said transporting said second melt uses a second pump different from said pump.

9. The method of claim 1, wherein determining when said solute concentration in said melt reaches said predetermined threshold is further based on a segregation coefficient of solutes and a volume of said melt in said sheet forming apparatus.

* * * * *